(12) United States Patent
Rabe et al.

(10) Patent No.: US 8,952,610 B2
(45) Date of Patent: Feb. 10, 2015

(54) ELECTROLUMINESCENT TEXTILE AND METHOD FOR THE PRODUCTION THEREOF

(75) Inventors: Maike Rabe, Neuss (DE); Evelyn Lempa, Krefeld (DE); Christine Maria Steinem, Mönchengladbach (DE)

(73) Assignee: Hochschule Niederrhein (DE)

( * ) Notice: Subject to any disclaimer, the term of this patent is extended or adjusted under 35 U.S.C. 154(b) by 164 days.

(21) Appl. No.: 13/320,555

(22) PCT Filed: May 20, 2010

(86) PCT No.: PCT/EP2010/056992
§ 371 (c)(1),
(2), (4) Date: Nov. 15, 2011

(87) PCT Pub. No.: WO2010/133681
PCT Pub. Date: Nov. 25, 2010

(65) Prior Publication Data
US 2012/0062110 A1  Mar. 15, 2012

(30) Foreign Application Priority Data

May 20, 2009  (DE) .......................... 10 2009 026 409

(51) Int. Cl.
*H01J 1/62* (2006.01)
*H01J 63/04* (2006.01)
(Continued)

(52) U.S. Cl.
CPC ............ *D06M 15/63* (2013.01); *D06P 1/0012* (2013.01); *D06N 3/183* (2013.01); *D06N 7/00* (2013.01); *H01L 27/3239* (2013.01); *H01L 51/0004* (2013.01); *H01L 51/0022* (2013.01); *H01L 51/0097* (2013.01); *H01L 51/56* (2013.01);
(Continued)

(58) Field of Classification Search
USPC ................. 313/509, 498, 511, 503, 506, 512; 445/23, 58; 362/103; 427/66
See application file for complete search history.

(56) References Cited

U.S. PATENT DOCUMENTS 5,786,664 A * 7/1998 Liu .............................. 313/506
5,856,029 A  1/1999 Burrows
(Continued)

FOREIGN PATENT DOCUMENTS

DE         296 00 047       4/1996
KR       1020090063172    * 6/2009

OTHER PUBLICATIONS

Written Opinion; Int'l Filing Date: May 20, 2010; PCT/EP2010/056992; Hochschule Niederrhein; 7 pages.
(Continued)

*Primary Examiner* — Thomas A Hollweg
(74) *Attorney, Agent, or Firm* — Schmeiser, Olsen & Watts, LLP

(57) ABSTRACT

A method for producing electroluminescent textiles and to electroluminescent textiles produced accordingly is provided. A layer arrangement (10) of an electroluminescent textile comprises a textile substrate (1), a protective layer (2), a first transparent conductive layer or front electrode (3), a light-emitting layer (4), a dielectric layer (5), a second conductive layer or back electrode (6), a conductive rail (7), and a cover layer (8). As associated method is further provided.

18 Claims, 2 Drawing Sheets

Figure 1:
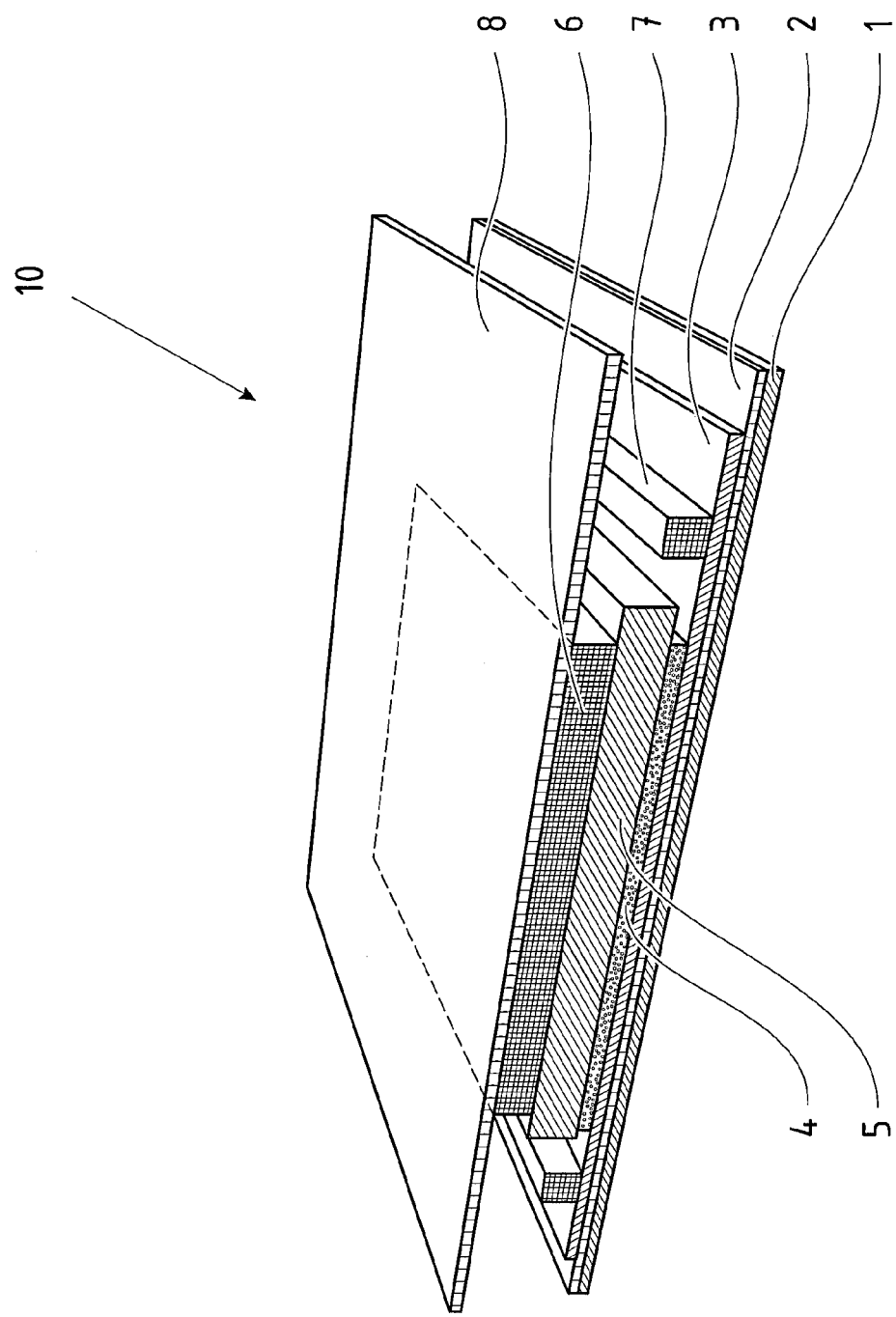

(51) Int. Cl.

| | | |
|---|---|---|
| *D06M 15/63* | (2006.01) | |
| *D06P 1/00* | (2006.01) | |
| *D06N 3/18* | (2006.01) | |
| *D06N 7/00* | (2006.01) | |
| *H01L 27/32* | (2006.01) | |
| *H01L 51/00* | (2006.01) | |
| *H01L 51/56* | (2006.01) | |

(52) U.S. Cl.
CPC ... *H01L2251/5338* (2013.01); *H01L 2251/558* (2013.01); *D06N 2211/10* (2013.01); *D06N 2209/0861* (2013.01); *D06N 2209/041* (2013.01); *D06N 2209/0892* (2013.01); *D06N 2209/043* (2013.01)
USPC .......... 313/509; 313/503; 313/506; 313/511; 313/512; 445/23; 445/58; 427/66; 362/103

(56) References Cited

U.S. PATENT DOCUMENTS

| | | |
|---|---|---|
| 5,856,030 A | 1/1999 | Burrows |
| 5,856,031 A | 1/1999 | Burrows |
| 5,980,976 A | 11/1999 | Burrows |
| 6,054,809 A | 4/2000 | Haynes et al. |
| 6,261,633 B1 | 7/2001 | Burrows |
| 6,270,834 B1 | 8/2001 | Burrows |
| 6,511,198 B1 * | 1/2003 | Erickson ..................... 362/103 |
| 6,517,226 B1 | 2/2003 | Zimmermann et al. |
| 6,811,895 B2 | 11/2004 | Murasko et al. |
| 7,029,763 B2 | 4/2006 | Kinlen |
| 7,303,827 B2 | 12/2007 | Kinlen et al. |
| 7,361,413 B2 | 4/2008 | Kinlen |
| 7,444,772 B2 * | 11/2008 | Harasawa et al. .............. 40/586 |
| 8,384,288 B2 * | 2/2013 | Park et al. .................... 313/609 |
| 2002/0155214 A1 | 10/2002 | Murasko et al. |
| 2004/0018379 A1 | 1/2004 | Kinlen |
| 2004/0018382 A1 * | 1/2004 | Kinlen ......................... 428/690 |
| 2005/0061671 A1 | 3/2005 | Murasko et al. |
| 2005/0248268 A1 | 11/2005 | Hardinger et al. |
| 2006/0092625 A1 | 5/2006 | McKowen |
| 2006/0127670 A1 | 6/2006 | Kinlen et al. |
| 2008/0220678 A1 | 9/2008 | Neudeck et al. |
| 2010/0195337 A1 | 8/2010 | Heite et al. |
| 2010/0277065 A1 | 11/2010 | Park et al. |

OTHER PUBLICATIONS

International Preliminary Report on Patentability; Int'l Filing Date: May 20, 2010; PCT/EP2010/056992; Hochschule Niederrhein; 8 pages.

International Search Report dated Aug. 30, 2010; Int'l Filing Date: May 20, 2010; PCT/EP2010/056992; Hochschule Niederrhein; 3 pages.

* cited by examiner

ELECTROLUMINESCENT TEXTILE AND METHOD FOR THE PRODUCTION THEREOF

FIELD OF TECHNOLOGY

The invention relates to the field of luminescent textiles. In particular, the invention relates to a method for the production of electroluminescent textiles as well as correspondingly produced electroluminescent textiles.

BACKGROUND

Luminescence describes a process in which an atom absorbs energy and then releases it by radiating a photon. Electroluminescence is understood as the direct luminescence excitation of luminescent pigments and/or luminophores or semiconductor crystals by an electric alternating- or direct-current field. The electroluminescence technology has lately gained increasing significance and allows for the realization of glare- and shadow-free homogeneous luminous surfaces.

Electroluminescent textiles are well known from the prior art and have a wide range of applications, for illumination purposes or in decorative textiles, in particular in safety clothing.

Electroluminescent textiles can, for example, be produced by integrating electrically conductive filaments or yarns. Document DE 10 2004 007 365 A1, for example, discloses a textile surface structure made of an arrangement of a plurality of conductive threads. The flexibility of such electroluminescent textiles is, however, limited. Moreover, the scope is limited for designs by embedding electrically conductive filaments, which have to be incorporated into the textile under production at an early stage. In addition, electroluminescent textiles may lose their usual hand feel, especially when a plurality of electrically conductive filaments is used.

Document WO 2009/030701 further discloses a two-part electroluminescence arrangement consisting of an electroluminescence element and a textile substrate. This arrangement is bonded with an adhesive, for example, made of TPU (thermoplastic polyurethane) by laminating a TPU film on the textile substrate and applying the separately produced unit of an electroluminescent layer arrangement thereto. Weak points or lamination defects may, however, disrupt the cohesion of such a laminate bonded by means of an adhesive layer, as a result of which the illuminating effect is disturbed at these points. Furthermore, mechanical effects or an ageing of the adhesive can also cause the detachment of the electroluminescence element from the textile supporting material.

SUMMARY

It was, therefore, the object of the invention to overcome at least one disadvantage of the prior art. In particular, the object of the invention was to provide electroluminescent textiles with improved flexibility.

According to the present invention, this object is attained by a method for the production of an electroluminescent textile according to claims 1 and 2 of the present invention. According to claim 1, a method for the production of an electroluminescent textile is provided comprising the following steps:

a) provision of a textile substrate;
b) optional application of a protective layer on a first surface of the textile substrate;
c) application of a first transparent conductive layer on the first surface of the textile substrate or on the protective layer;
d) application of at least one light emitting layer on the transparent conductive layer;
e) application of at least one dielectric layer on the light emitting layer;
f) application of at least a second conductive layer on the dielectric layer;
g) optional attachment of connection elements on the conductive layers;
h) application of a surface layer on the electroluminescent layer arrangement; and
i) electrical connection of the first transparent conductive layer and of the second conductive layer to a power supply.

According to claim 2, a method for the production of an electroluminescent textile is specified comprising the following steps:

a) provision of a textile substrate;
b) optional application of a protective layer on a first surface of the textile substrate;
c) application of a conductive layer on the first surface of the textile substrate or on the protective layer;
d) application of at least one dielectric layer on the conductive layer;
e) application of at least one light emitting layer on the dielectric layer;
d) application of at least one transparent conductive layer on the light emitting layer;
g) optional attachment of connection elements to the conductive layers;
h) application of a surface layer on the electroluminescent layer arrangement; and
i) electrical connection of the transparent conductive layer and of the conductive layer to a power supply;

A further object of the invention relates to an electroluminescent textile. Further advantageous embodiments of the invention will be apparent from the subclaims.

According to the present invention, an electroluminescent layer arrangement is applied on the provided textile substrate. The electroluminescent layer arrangement allows for the production of a textile whose electroluminescent materials can be excited to emit light after applying an AC voltage, as a result of which a self-luminous textile is obtained.

The electroluminescent layer arrangement consistent with the present invention preferably comprises at least one first conductive layer, one light emitting layer, a first dielectric layer and a second conductive layer. The electroluminescent layer arrangement can optionally comprise at least one protective layer.

It was surprisingly found that electroluminescent textiles can be produced with the method according to the present invention and can provide good textile flexibility. In particular, the electroluminescent textiles which can be produced by means of the method according to the present invention can advantageously preserve the usual textile hand-feel.

Another important advantage of the textiles which can be produced by means of the method according to the present invention is that, according to the present invention, the electroluminescent layer arrangement, in particular the protective layer or the first transparent conductive layer, can be applied directly on the textile. In this way, the textile and the electroluminescent layer arrangement are firmly and non-detachably fixed to one another. A one-part electroluminescent product is thus produced. This advantageously prevents disruptions of the luminous effect caused by the disrupted cohesion of the textile substrate and the electroluminescent layer arrangement, as they can occur due to errors in applying a bonding agent layer or due to an aged bonding agent. Furthermore, a one-part electroluminescent textile has the great advantage that the electroluminescent layer arrangement is not at risk of being separated from the textile, as it can easily happen, for example, in the case of a laminated arrangement.

Moreover, the process step of laminating the electroluminescent layer arrangement is obviated with the method according to the present invention, as a result of which the method allows for a more cost-effective production of electroluminescent textiles. The production method is also significantly simplified because the electroluminescent layer arrangement need not be produced separately and bonded with the substrate in an additional step. Furthermore, the flexibility of the electroluminescent textiles produced with the method according to the present invention is not reduced by a bonding agent layer.

According to the present invention, the individual layers are arranged such that the electroluminescent layer is preferably arranged on the reverse side of the textile, as a result of which the effect of textiles "lighting up from the inside" can be accomplished. The arrangement of the electroluminescent layer on the reverse side of the textile has substantial advantages. It makes it possible, on the one hand, to have the front side of the textile available for creating motifs and/or for further color arrangements on the textile. On the other hand, the electroluminescent layer arrangement on the reverse side of the textile makes it possible to include the luminous effect in the structure of the textile because it not only serves as a substrate but the luminous path runs through the textile.

This further allows for an easier application of the individual layers because the front electrode, a transparent conductive layer, for example, is directly applied on the surface of the textile substrate or on a protective layer placed thereon, and optionally applied non-transparent layers are arranged underneath.

As the front side of the textile is available for creating motifs and/or for further color arrangements on the textile, there are many possibilities of designing the electroluminescent textiles. The motif designs can in particular play a very important role.

Color and design effects can, for example, be further implemented by using luminescent pigments in the light emitting layer. They can be applied with a plain-colored or multicolored luminescence. Color or design effects can also be implemented by previously printing the front side of the textile substrate, for example, by means of pigment printing. In this case, plain-colored or multicolored designs can also be used. By combining and coordinating color printed surfaces and luminous colors originating from the textile, a great variety of effects can in turn be created.

The color and luminous effects that can be produced in particular allow for great design flexibility. It is, for example, possible to combine a colored motif, which is also visible without illumination in daylight, with a luminous motif, which becomes apparent with illumination, especially during the night. In particular this can be advantageously used, for example, for louvers, glare shields, roller blades, lamp shades and similarly for restaurants, hotels, medical offices and children's rooms.

The materials of the individual layers can be applied in the form of commercially available pastes, for example, so-called electroluminescent (EL) pastes. The use of electroluminescent (EL) pastes in particular makes it possible to apply the layers in the form of a coating or of a print. Suitable pastes are, for example, available under the commercial name Ormecon® EL from Ormecon. The respective paste systems comprise conductive, insulating and luminescent pastes which allow for the production of a flexible electroluminescent layer arrangement on textile substrates.

The use of electroluminescent pastes for direct application of electroluminescence on textiles offers a number of advantageous properties. The pastes preferably form stable dispersions with low settling properties and can have a good adhesive bond to different substrates which supports their use on textiles. Furthermore, almost textile-like processing, quick drying at suitable temperatures and high luminous efficacy can be available in the finished product. Electroluminescence pastes in particular offer the possibility of being applied in thin layers directly on a textile material, as a result of which the textile character can almost be preserved. It is also an advantage that coating with electroluminescent pastes can be carried out with already available machines, which are usually used for coating textiles with polymers for special functionalizations.

In preferred embodiments of the method, the respective layer is applied by continuous or discontinuous coating, or by continuous or discontinuous printing.

Especially preferred is the application of layers by means of continuous or discontinuous coating. Coating is preferably carried out by spreading, blade coating, web feeding, roller coating, spraying or dipping. It is further advantageous that coating allows for direct application without a stencil. The direct coating method by means of which the coating compound is directly blade coated onto the textile substrate is preferred. The width at which a paste is applied is advantageously continuously variable, dependent on the configuration of the used coating machine. In all application systems, the width can be varied by means of manual or motor-driven lateral adjustment elements. Lateral limiting elements and/or a front plate can also be added by means of coating which keeps the paste basin closed. This addition is in particular advantageous in the case of coating pastes of low viscosity because it can be prevented from running along the product. Roller coating or air blade coating is preferred.

It is a great advantage that the coating method allows for a precise definition of the layers to be applied. A considerably thinner and more uniform layer thickness, which is very important for the good functionality of an electroluminescent textile, can be applied by means of coating.

Especially preferred also is the application of layers by means of continuous or discontinuous printing, preferably by means of the direct printing method, selected from the group comprising screen printing, roller printing, digital printing and/or transfer printing, which provide different possibilities of applying the layers or pastes on a textile. In terms of the present invention, the expression "direct printing" is understood as direct printing on the respective substrate.

Especially preferred is screen printing, also called film or stencil printing. This allows for a very easy and homogeneous application of the pastes. A homogeneous application is in particular very important for a uniform luminous effect of the textile. It is also of advantage that patterns to be applied by screen printing can be freely selected, large repeat patterns or continuous patterns can in particular be applied by means of screen printing. Complex pattern formations are advantageously possible by screen printing when printing with stencils.

When the layers are applied by means of the coating method, the layer is applied over the entire surface in the usual manner A pattern is formed by means of coating methods, preferably by applying a motif to the uncoated side of the textile, for example by pigment printing. Such printing preferably takes place before the electroluminescent layer arrangement is applied on the reverse side of the textile.

In preferred implementation procedures, the method comprises the application of a motif, preferably by printing or dyeing on a second surface of the textile substrate. The second surface of the textile substrate is preferably the front side of the electroluminescent textile. The method preferably comprises printing on the front side of the textile substrate.

The design of the electroluminescent textile on the front side of the substrate can be accomplished by dyeing or printing. The coordination of the colors of the substrate and a possible textile print with the color of the light of the possible different luminophores can attain completely new effects. The light can partially shine through the motif or be covered by the pattern, which is illuminated from behind when it is connected to a power supply.

The design of the patterns in the foreground, in particular by means of different textile prints on the front side, offers great possibilities of variation because any desired motif can in principle be printed. A pattern design with great possibilities of variation is thus possible. In this way, any desired shape and any motif can be applied. The motif can, for example, be selected from the group comprising one or more image(s), word(s) and/or pictogram(s).

The textile can be designed according to the type of fiber by means of known dyeing and printing methods. In this case the print can be fixated on the textile by means of usual fixating conditions. The textile substrate is preferably pretreated prior to the application of the electroluminescent layer arrangement. The textile substrate can, for example be fixated by a thermal treatment called thermofixation prior to being coated. Such a pretreatment can ensure that the textile substrate is as dimensionally stable as possible and changes in dimension during coating or intermediate drying can to a large extent be eliminated.

A preferred pretreatment is, depending on the type of fiber, washing the textile in order to remove impurities as well as possible preparations or sizing agent residues which could distort the outcome of the coating or prevent the absorption of the paste.

Basically any textile substrate can be used. Suitable textile substrates are, for example, selected from the group comprising woven, nonwoven, knitted fabrics or a combination thereof. Suitable textile materials are for example vegetable fibers, animal fibers, mineral fibers of geological origin, man-made fibers, synthetic polymer fibers, inorganic man-made fibers or synthetic leather. Suitable textile materials are preferably cotton, silk, linen and/or synthetic fibers selected, for example, from the group comprising polyamide, polyacryl, elastane, polyester and/or polyethylene. In terms of the invention, these materials should preferably be understood by the expression "textile", denser and/or firmer textile substrates being of advantage for printing or coating. Especially preferred is a very dense fabric made of polyester. The pastes, which are, for example, available from Ormecon can advantageously be applied very well.

Textiles, which are more porous or very absorptive, can previously preferably be provided with a protective layer which makes the coated side of the textile impervious and dense but leaves the textile character of the other side unchanged.

Another optional step of the method is the application of a protective layer on a first surface of the textile substrate. The first surface of the textile substrate is preferably the rear side, which will later be the reverse side of the textile. In other embodiments, the first surface of the textile substrate can be the later front side of the textile. In this embodiment, the electroluminescent layer arrangement is located on the later front side of the textile.

The application of a protective layer can serve in particular as a protection against undesired impregnation of the fabric with the layer to be applied. The protective layer is preferentially applied before applying the electroluminescent layer arrangement on the textile substrate. The protective layer is preferentially applied as a one-sided coating. It is an advantage that such a protective layer cannot, or can hardly, be felt and preserves the textile properties. The thickness of the protective layer preferentially is in the range from $\geq 0.5$ µm to $\leq 10$ µm, preferentially in the range from $\geq 1$ to $\leq 5$ µm. The application of a protective layer provides in particular the possibility of using any type of textiles as substrates.

It can further be provided that another protective layer is applied on the second surface of the textile substrate. The second surface of the textile substrate is preferably the front surface, which will later be the front side of the textile. Such a coating can serve as a protection against external influences, in particular against water and dry atmospheric dirt. The thickness of the external protective layer preferentially is in the range from $\geq 0.5$ µm to $\leq 10$ µm, preferentially in the range from $\geq 1$ to $\leq 5$ µm.

Preferred materials for the protective layer are polymers selected from the group comprising silicones, polyurethanes, polyvinyl chloride, polysulphides and/or acrylates, preferentially selected from the group comprising silicones and/or polyurethanes. In especially preferred embodiments, the application of a protective layer on a first surface, preferentially the later reverse side, of the textile substrate comprises the application of a polyurethane. The application of a protective layer on the second surface, preferentially the later front side, of the textile substrate also preferentially comprises the application of a silicone.

In a next step, a transparent light emitting layer is preferentially applied possibly covering the entire first surface, preferentially the later reverse side of the textile substrate, or on the optionally applied protective layer. The transparent light emitting layer is also called the front electrode. The transparency or light permeability is very important because, apart from conducting the current, this layer allows the light which is emitted by the light emitting layer, to radiate outward.

Conductive transparent polymers, preferentially polyethylenedioxithiophene (PEDOT), are preferably used for forming the transparent conductive layer. The conductive layer can also be formed of transparent conductive materials like indium tin oxide. The transparent conductive layer can also be formed by a polyester film which is coated with indium tin oxide (ITO) or another conductive polymer. Indium tin oxide is electrically conductive as well as transparent, and can advantageously support a high light transmittance of the electroluminescent layer arrangement.

A transparent conductive paste made of a polymer-based 3,4-polyethylenedioxithiophene (PEDOT) dispersion is preferably used. A corresponding conductive paste is available, for example, under the name Ormecon® EL 5602 from Ormecon.

An especially good light output, in particular planar lighting, can be created if the transparent conductive layer or front electrode is applied as thin as possible. In preferred embodiments, the transparent conductive layer is applied with a layer thickness in the range from $\geq 2$ µm to $\leq 15$ µm, preferentially in the range from $\geq 5$ µm to $\leq 12$ µm, preferably in the range from $\geq 8$ µm to $\leq 10$ µm.

The transparent conductive layer or front electrode further has a surface coverage in the range from ≥300 cm$^2$/g to ≤400 cm$^2$/g, preferably of ≥350 cm$^2$/g.

According to a preferred method, at least one light emitting layer is applied, preferably centered, to the transparent conductive layer in a subsequent step. In terms of the invention, the expression "light emitting layer" is understood as a layer which contains an electroluminescent material, luminescent pigments, for example. A defined free border respectively having a width of at least 2 cm is preferentially left on the sides of the front electrode. The light emitting layer is of fundamental importance for the electroluminescence of the textile. Organic light emitting polymers or inorganic materials are in particular preferably used for the formation of the light emitting layer. Inorganic light emitting materials are preferred.

The luminescence is preferentially conveyed by so-called luminescent pigments which are embedded in a bonding agent. The luminescent pigments preferentially are binary compounds, for which luminescent substances, luminophores and phosphors are used. These components belong to the group of the light bearing (Greek: phosphoros), luminescent (luminophor) and light emitting (fluorescent) elements which can be activated by irradiation with short-wave light, UV, X-ray, or electron beams. The light emitting layer can also be called illuminant layer or phosphor layer. In preferred embodiments, the light emitting layer comprises luminescent pigments which are embedded in an organic or ceramic bonding agent.

Inorganic SiC and/or ZnS-based phosphors are preferred luminescent pigments which are doped with metals, preferentially selected from the group comprising Cu, Mn, Ag, Au, Pb, P, As, Sb, Sn, V, Tl, Sc, Cr and/or rare earths. This doping of ZnS or SiC with foreign atoms can result in diverse colors. The color tint and/or the wavelength ranges of the emitted light can be determined in particular by the dopant.

One or more light emitting layers are applied when using coating techniques. When using printing techniques, stencils with different patterns and shapes can be used apart from applying two or more light emitting layers. One or more light emitting layers with different patterns and shapes can also be advantageously applied by means of digital printing. In this case, it is especially advantageous that the digital design can be transferred very well to the textile with airbrushes. This advantageously results in increased possibilities of variations in the configuration of the color and pattern designs on the electroluminescent textile.

The light emitting layer can be applied over the entire surface or in the form of desired motifs and/or in one or more colors. The light emitting layer can in particular be produced by using one or more illuminants containing luminescent pigments of different colors.

Using printing techniques for the application of the light emitting layer in particular provides a great number or variation possibilities for color and/or pattern designs. Any motif, especially geometrical patterns or series of letters, can advantageously be screen printed, for example. For example, the motif can be selected from the group comprising one or more image(s), word(s), logo(s) and/or pictogram(s). Complex color patterns can also be realized by applying different luminescent pigments. Any desired shape and any motif can advantageously be applied in this way.

Zinc sulphide is preferred, for example, as the basis for such a luminescent pigment Zinc sulphide doped with metals like copper or manganese is preferred for the formation of the light emitting layer. The luminescent pigments can be covered by a transparent layer which can advantageously protect the luminescent pigments against humidity. A corresponding light emitting paste is available, for example, under the name Ormecon® EL 5400 from Ormecon.

An especially good light output, in particular planar lighting, can be created if the transparent conductive layer is applied as thin as possible. In preferred embodiments, the light emitting layer is applied with a layer thickness in the range from ≥2 μm to ≤20 μm, preferably in the range from ≥5 μm to ≤15 μm, preferably in the range from ≥8 μm to ≤12 μm.

According to a preferred method, at least one dielectric layer is applied on the light emitting layer in a subsequent step. The dielectric layer preferentially overlaps the luminous layer by at least 5 mm on each side, leaving an adequately free area of the front electrode of at least 1.5 cm. The dielectric layer preferentially contains a material having a high dielectric constant, for example barium titanate, which is preferentially distributed in a polymeric bonding agent, as a result of which a printable paste can be produced. A corresponding dielectric paste is available, for example, under the name Ormecon® EL 5500 from Ormecon.

At least one dielectric layer is usually applied. At least two or more dielectric layers are preferentially applied. This can result in increased insulating properties, reducing the risk of a contact between the conductive layers of the layer arrangement. The dielectric layer preferentially covers the entire surface of the light emitting layer. Said dielectric layer preferably does not, however, cover the entire surface of the front electrode, making an at least small surface of the front electrode available for a later connection to the power supply.

Good insulation associated with good flexibility of the electroluminescent textile could be generated, if the at least one dielectric layer(s) is applied with a total layer thickness in the range from ≥10 μm to ≤50 μm. In preferred embodiments, the at least one dielectric layer(s) is applied with a total layer thickness in the range from ≥10 μm to ≤50 μm, preferentially in the range from ≥15 μm to ≤40 μm, preferably in the range from ≥20 μm to ≤30 μm. The dielectric layer preferentially has a layer thickness in the range from ≥5 μm to ≤50 μm, preferentially in the range from ≥8 μm to ≤40 μm, preferably in the range from ≥15 μm to ≤30 μm.

In terms of the present invention, the order in which the light emitting layer and the dielectric layer are applied can vary. In one embodiment in which the first surface of the textile substrate is the reverse side, the light emitting layer can be applied for example, before the dielectric layer, whereas in another embodiment in which the first surface of the textile substrate is the front side, the dielectric layer can be applied before the light emitting layer.

According to an alternative method, a method for the production of an electroluminescent textile is made available comprising the following steps:
 a) provision of a textile substrate;
 b) optional application of a protective layer on a first textile substrate surface;
 c) application of a conductive layer on the first surface of the textile substrate or on the protective layer;
 d) application of at least one dielectric layer on the conductive layer;
 e) application of at least one light emitting layer on the dielectric layer;
 d) application of at least one transparent conductive layer on the light emitting layer;
 g) optional attachment of connection elements to the conductive layers;
 h) application of a surface layer on the electroluminescent layer arrangement; and i) electrical connection of the transparent conductive layer and of the conductive layer to a power supply;

If the first surface of the textile substrate forms the later front side, it is possible alternatively to reverse the respective order in which the layers of the electroluminescent layer arrangement are applied. With this method, the conductive layer, also called rear electrode, is applied on the first surface of the textile substrate, to which the dielectric layer is then applied, and subsequently the light emitting layer is applied on the dielectric layer, applying the transparent layer, also called front electrode, afterward. The light path does not pass through the textile in the correspondingly produced arrangement. In this respect, it is preferred to apply a non-transparent conductive layer on the first surface of the textile substrate or on the protective layer.

Unless otherwise indicated, the expression "first" transparent conductive layer is used in the present invention in relation to the front electrode, whereas the expression "second" conductive layer is used in relation to the rear electrode. According to the alternative method described above, the "second" conductive layer or rear electrode is correspondingly applied in the first instance, and only subsequently is the "first" transparent conductive layer or front electrode applied.

According to a preferred method, at least one second conductive layer is applied, preferably centered, to the dielectric layer in a subsequent step. The second conductive layer spaced apart at least 5 mm preferably does not overlap the area of the dielectric. This layer is preferentially applied exactly over the light emitting layer. The second conductive layer can be a transparent or non-transparent layer and is also called the rear electrode.

Conductive polymers, preferentially selected from the group comprising polyaniline, polypyrrole and/or polyethylenedioxithiophene (PEDOT), for example, can be used for the application of the conductive layer. Conductive materials, preferentially silver- or carbon particles, which are contained in a polymer, can also be used for the formation of the conductive layer. A conductive paste containing silver can preferentially be used, in particular, a paste containing silver and polyaniline can preferably be used. The conductive layer can also be formed of transparent conductive materials like indium tin oxide. A suitable conductive paste is available, for example, under the name Ormecon® EL 5800 from Ormecon.

Good conductivity associated with good flexibility of the electroluminescent textile could be generated, if at least one second conductive layer(s) is applied with a total layer thickness in the range from $\geq 10$ µm to $\leq 80$ µm. In preferred embodiments, the at least one second conductive layer(s) is applied with a total layer thickness in the range from $\geq 10$ µm to $\leq 80$ µm, preferentially in the range from $\geq 15$ µm to $\leq 50$ µm, preferably in the range from $\geq 20$ µm to $\leq 40$ µm. A second conductive layer preferentially has a layer thickness in the range from $\geq 5$ µm to $\leq 80$ µm, preferentially in the range from $\geq 15$ µm to $\leq 40$ µm, preferably in the range from $\geq 20$ µm to $\leq 30$ µm. The second conductive layer on the dielectric layer does not touch the first conductive layer (front electrode). Upon connection to a power supply, this allows the electrical current to flow through all layers and prevent a short-circuit.

Good electroluminescence and good flexibility of the textile can at the same time be provided by coordinating the layer thicknesses. It is especially advantageous that the usual textile hand-feel can be preserved.

In a preferred embodiment, the method according to the present invention comprises that a first transparent conductive layer with a layer thickness in the range from $\geq 2$ µm to $\leq 15$ µm, preferentially in the range from $\geq 5$ µm to $\leq 12$ µm, preferably in the range from $\geq 8$ µm to $\leq 10$ µm, and/or at least one light emitting layer(s) with a total layer thickness in the range from $\geq 2$ µm to $\leq 20$ µm, preferentially in the range from $\geq 5$ µm to $\leq 15$ µm, preferably in the range from $\geq 8$ µm to $\leq 12$ µm, and/or at least one dielectric layer(s) with a total layer thickness in the range from $\geq 10$ µm to $\leq 50$ µm, preferentially in the range from $\geq 15$ µm to $\leq 40$ µm, preferably in the range from $\geq 20$ µm to $\leq 30$ µm, and/or at least a second conductive layer(s) with a total layer thickness in the range from $\geq 10$ µm to $\leq 80$ µm, preferentially in the range from $\geq 15$ µm to $\leq 50$ µm, preferably in the range from $\geq 20$ µm to $\leq 40$ µm, is applied.

According to the present invention, the thicknesses of the individual layers of the electroluminescent layer arrangement are selected such that good electroluminescence can be provided, while at the same time the flexibility of the textile is preserved. The total layer thickness of the electroluminescent layer arrangement is preferentially thinner than the thickness of the textile substrate. This contributes significantly to the preservation of the textile hand-feel of the produced electroluminescent textile.

In a preferred embodiment, the method according to the present invention comprises that an electroluminescent layer arrangement having a total layer thickness in the range from $\geq 0.1$ mm to $\leq 1$ mm, preferentially in the range from $\geq 0.15$ mm to $\leq 0.5$ mm, preferably in the range from $\geq 0.18$ mm to $\leq 0.3$ mm, preferably in particular in the range from $\geq 0.19$ mm to $\leq 0.2$ mm, is applied.

A total layer thickness of the electroluminescent layer arrangement less than 1 mm is substantially smaller than in commonly known electroluminescent textiles. An especially good flexibility of the textiles produced according to the present invention can be made available with total layer thicknesses of the electroluminescent layer arrangement in the range from $\geq 0.15$ mm to $\leq 0.5$ mm, preferably in the range from $\geq 0.18$ mm to $\leq 0.3$ mm. Especially in the case of total layer thicknesses of the electroluminescent layer arrangement in the range from $\geq 0.19$ mm to $\leq 0.2$ mm the total layer structure of the electroluminescent layer arrangement can be thinner than a thin textile substrate. As a result, the produced electroluminescent textile preserves its textile hand-feel. In this way, the textile character of the electroluminescent textile in general can be advantageously preserved.

It is also of advantage that, depending on the properties of the textile support, such a thin electroluminescent textile can have a bending radius in the range from $\geq 1$ cm to $\leq 2$ cm. This allows for the use of the electroluminescent textile for diverse applications.

Fixation of the respective layers can be accomplished by means of drying steps after each application. The applied paste is preferentially dried and fixated by means of respective subsequent drying processes. A solidified layer can thus form on which further pasty layers can be applied. It is of advantage that by using the pastes and drying the individual layers no draining, additional drying or thermofixation is necessary.

It was found that drying steps at 90° C. to 130° C. for one to five minutes are sufficient for adequately drying the layers. Drying is preferentially carried out at temperatures in the range from $\geq 70°$ C. to $\leq 130°$ C., preferentially in the range from $\geq 80°$ C. to $\leq 120°$ C., preferably in the range from $\geq 90°$ C. to $\leq 95°$ C. Drying is preferably carried out in a period from $\leq 0.5$ minutes to 10 minutes, preferentially in a period from $\leq 1$ minute to $\leq 5$ minutes. Drying, in particular of the dielectric and of the second conductive layer, in the range from $\geq 90°$ C.

to ≤95° C. advantageously reduces the formation of tears and/or blisters in the layers. As a result, the electroluminescence across the individual layer is further improved.

In a preferred embodiment, the method according to the present invention comprises the application of a conductive bar on the first transparent conductive layer. It is of advantage to attach a conductive bar, a so-called bus bar, to the sides, in particular to the border of the electroluminescent surface. This can advantageously ensure a uniform luminescence of larger surfaces. This conductive bar is preferentially applied all round. The conductive bar preferably runs all around the dielectric layer and rests on the transparent conductive layer. The conductive bar can have the function of an additional peripheral electrode to support the transparent first electrode layer, and for a uniform electric power distribution.

The conductive bar is preferably made of the material of the second conductive layer. The conductive bar is preferentially configured in a common step with the second conductive layer. The conductive bar preferentially, however, does not contact the second conductive layer as well as the dielectric. This prevents a short-circuit in the electroluminescent layer arrangement.

A conductive bar or bus bar is preferentially applied with a total layer thickness in the range from ≥10 μm to ≤80 μm, preferentially in the range from ≥20 μm to ≤50 μm, preferably in the range from ≥30 μm to ≤40 μm.

The insulation of the conductive layers by means of the dielectric is necessary for the functionality of the electroluminescent layer arrangement. This functionality can be ensured by the design and/or geometry of the individual layers during application. It is in particular advantageous if the individual layers rest one on top of the other as accurately as possible, in particular at defined distances. This allows an interaction of the layers for generating the electroluminescence and to prevent sources of errors.

In this connection, the use of printing stencils is in particular helpful when applying printing techniques. An exact coordination of the dimensions of the individual surfaces is helpful when using coating techniques.

The light emitting layer is preferably applied centered on the first transparent conductive layer or front electrode. The dielectric layer covers the light emitting layer as completely as possible, preferentially somewhat exceeding the border. The borders of the first conductive layer or front electrode are preferentially not covered so that they can be contacted with a power supply. The second conductive layer or rear electrode does not touch the first conductive layer or front electrode in order to prevent a short-circuit.

In a further optional step, connection elements are attached to the conductive layers. The connection elements can be used for the electrical connection of the conductive layers to a power supply. The connection elements advantageously simplify the electrical connection of the conductive layer to the power supply.

An additional connection element, for example a metal foil, in particular a copper foil, onto which a wire is preferentially soldered, is preferably attached to the lateral borders of the transparent conductive layer, in particular to the conductive layer and to the second conductive layer, the rear electrode. Such a connection element can be affixed, for example. The connection element can advantageously be a copper foil, for example, preferentially with a wire, in order to contribute to an easier handling and/or to a more uniform distribution of the voltage. A wire soldered onto a connection element can further advantageously facilitate the electrical connection of the conductive layers to the power supply via the connection elements.

In a further step, a top layer is applied on the electroluminescent layer arrangement. The top layer can provide various advantages, an electrical insulation of the electroluminescent layer arrangement, for example. The risk of a short-circuit due to a contact of the layers can consequently be reduced, for example on handling the electroluminescent textile. Furthermore, the risk of an electric shock for a person touching the textile can also be reduced. A top layer can further insulate the coated surfaces of the textile from other coated or non-coated surfaces.

The top layer is preferentially a transparent and/or an elastic top layer. The top layer preferentially has electrical insulating properties. Materials selected from the group comprising polyurethanes, acrylates, polyvinyl chloride and/or polytetrafluoroethylene (PTFE) can preferably be used. Forming a top layer by applying a non-conductive polymer, preferably polyurethane with the addition of ceramic or silicone is also preferred.

The top layer can preferably be applied by means of lamination or coating. For example, the electroluminescent layer arrangement can be laminated with a film of the insulating material and subsequently a protective laminate can be applied to the electroluminescent textile. It is of particular advantage here that the electroluminescent layer arrangement is preferentially applied on the reverse side of the electroluminescent textile, and that such a top layer or protective laminate does not affect the properties of the electroluminescent textile. Furthermore, the textile hand-feel of the textile surface is not affected by a rear top layer or protective laminate. The top layer protects persons during handling. The top layer also protects the textile as such against the effects of humidity, dirt, UV radiation and the like. A blackout effect is also possible in this layer by adding light absorbing materials.

In other embodiments a motif and/or color can likewise be applied on the top layer, preferentially if the top layer is the side of the electroluminescent textile facing the observer. For example, such a motif can be applied by means of film printing.

The electroluminescent layer arrangement can be excited to emit light by means of AC voltage. In a further step, the first transparent conductive layer and the second conductive layer are therefore connected to a power supply, preferentially via connection elements. The transparent conductive layer is electrically connected to the positive or negative polarity, whereas the second conductive layer is connected to the respective other polarity.

The power supply is preferably an AC voltage source. A power source can of course be used. The electroluminescent textile can also be connected to a DC voltage source, for example a domestic power source, if an inverter or voltage transformer transforms the DC voltage into the required AC voltage. The electroluminescent textile is therefore preferentially connected to a DC power source via an inverter. A transportable power supply, a battery, for example, can advantageously be the power supply. Preferentially, the transportable power supply is a battery for example, as well as a possibly required inverter which transforms the voltage of the transportable power supply into AC voltage, integrated into the textile substrate. This means that the electroluminescent textile can be configured as an article of clothing, for example.

Another subject matter of the invention relates to an electroluminescent textile made with the method according to the present invention.

The electroluminescent textile produced by means of the method according to the present invention preferentially comprises the following steps:

a textile substrate;
optional application of a protective layer on a first surface of the textile substrate;
a first transparent conductive layer on the first surface of the textile substrate or on the protective layer;
at least one light emitting layer;
at least one dielectric layer;
at least one second conductive transparent or non-transparent layer;
optional electrical connection elements on the conductive layers;
a top layer.

In another embodiment, the electroluminescent textile produced by means of the method according to the present invention preferentially comprises the following steps:
a textile substrate;
an optional protective layer on a first surface of the textile substrate;
a transparent or non-transparent, preferentially non-transparent, conductive layer on the first surface of the textile substrate or on the protective layer;
at least one dielectric layer;
at least one light emitting layer;
at least one conductive transparent layer;
optional electrical connection elements to the conductive layers;
a top layer.

A further subject matter of the invention relates to an electroluminescent textile comprising:
a textile substrate;
an optional protective layer on a first surface of the textile substrate;
a first transparent conductive layer on the first surface of the textile substrate or on the protective layer;
at least one light emitting layer;
at least one dielectric layer;
at least one second conductive transparent or non-transparent layer;
optional electrical connection elements on the conductive layers;
a top layer.

A further subject matter of the invention relates to an electroluminescent textile comprising:
a textile substrate;
an optional protective layer on a first surface of the textile substrate;
a transparent or non-transparent, preferentially non-transparent, conductive layer on the first surface of the textile substrate or on the protective layer;
at least one dielectric layer;
at least one light emitting layer;
at least one conductive transparent layer;
optional electrical connection elements to the conductive layers;
a top layer.

For describing the textile substrate, the layers and the connection elements, reference is made to the above description.

A significant advantage of the electroluminescent textiles that can be produced in particular according to the present invention is that the textile and the electroluminescent layer arrangement are firmly and permanently fixated to one another. The electroluminescent textiles that can advantageously be produced in particular according to the present invention have no bonding agent layer. A one-part electroluminescent textile is thus advantageously available. This can prevent disruptions of the luminous effect caused by the disrupted cohesion of the textile substrate and of the electroluminescent layer arrangement, as they can occur by applying a bonding agent layer or due to ageing of the bonding agent. Furthermore, a one-part electroluminescent textile has the great advantage that the electroluminescent layer arrangement is not at risk of being separated from the textile, as can easily happen, for example, in the case of an affixed arrangement. Furthermore, the flexibility of the electroluminescent textiles produced with the method according to the present invention is not reduced by a bonding agent layer.

In a preferred embodiment, the textile substrate of the electroluminescent textile, in particular produced by means of the method according to the present invention, comprises a motif print on a second surface. The second surface of the textile substrate is preferentially the front side of the electroluminescent textile. The motif print can be made by dyeing or printing, in particular pigment printing. The electroluminescent textile can in particular have several prints of different colors. The electroluminescent textile can have colored or multicolor luminous motifs by means of multicolor printing.

In other preferred embodiments of the electroluminescent textile, in particular produced by means of the method according to the present invention,
the first transparent conductive layer has a layer thickness in the range from $\geq 2$ μm to $\leq 15$ μm, preferentially in the range from $\geq 5$ μm to $\leq 12$ μm, preferably in the range from $\geq 8$ μm to $\leq 10$ μm; and/or
the at least one light emitting layer(s) has a total layer thickness in the range from $\geq 2$ μm to $\leq 20$ μm, preferentially in the range from $\geq 5$ μm to $\leq 15$ μm, preferably in the range from $\geq 8$ μm to $\leq 12$ μm; and/or
the at least one dielectric layer(s) has a total layer thickness in the range from $\geq 10$ to $\leq 50$ μm, preferentially in the range from $\geq 15$ μm to $\leq 40$ μm, preferably in the range from $\geq 20$ μm to $\leq 30$ μm; and/or
the at least one second conductive layer(s) has a total layer thickness in the range from $\geq 10$ to $\geq 80$ μm, preferentially in the range from $\geq 15$ μm to $\leq 50$ μm, preferably in the range from $\geq 20$ μm to $\leq 40$ μm.

The textile properties of the textile substrate can advantageously be preserved. This represents a great advantage compared to film coating, where the films are applied to the textile, as a result of which the textile structure is covered.

The total layer thickness of the electroluminescent layer arrangement is preferentially thinner than the thickness of the textile substrate. This significantly contributes to the preservation of the textile hand-feel of the electroluminescent textile. It is especially of advantage here that good electroluminescence can be provided, and the flexibility of the textile is at the same time preserved.

In a preferred embodiment, the total layer thickness of the electroluminescent layer arrangement is in the range from $\geq 0.1$ mm to $\leq 1$ mm, preferentially in the range from $\geq 0.15$ mm to $\leq 0.5$ mm, preferably in the range from $\geq 0.18$ mm to $\leq 0.3$ mm, preferably in particular in the range from $\geq 0.19$ mm to $\leq 0.2$ mm.

A total layer thickness of the electroluminescent layer arrangement less that 1 mm is substantially smaller than in commonly known electroluminescent textiles. An especially good flexibility of the textiles according to the present invention can be provided with total layer thicknesses of the electroluminescent layer arrangement in the range from $\geq 0.15$ mm to $\leq 0.5$ mm, preferably in the range from $\geq 0.18$ mm to $\leq 0.3$ mm. Especially in the case of total layer thicknesses of the electroluminescent layer arrangement in the range from $\geq 0.19$ mm to $\leq 0.2$ mm, the total layer structure of the electroluminescent layer arrangement can be thinner than a thin textile substrate. As a result, the produced electroluminescent textile preserves its textile hand-feel. In this way, the textile character of the electroluminescent textile can in general be advantageously preserved.

It is also of advantage that, depending on the properties of the textile support, such a thin electroluminescent textile can have a bending radius in the range from ≥1 cm to ≤2 cm. This allows for the use of the electroluminescent textile for diverse applications.

Suitable textile substrates are selected, for example, from the group comprising woven, nonwoven, knitted fabrics or a combination thereof. Suitable textile materials are, for example, vegetable fibers, animal fibers, mineral fibers of geological origin, fibers made of synthetic polymers, inorganic man-made fibers or synthetic leather. Suitable textile materials are preferably cotton, silk, linen and/or synthetic fibers selected, for example, from the group comprising polyamide, polyacryl, elastane, polyester and/or polyethylene. In terms of the invention, these materials are preferably to be understood by the expression "textile".

Denser and/or firmer textile substrates are of advantage. Especially preferred is a very dense fabric made of polyester, and the pastes can be readily applied thereon.

Textiles, which are more porous or very absorptive, can preferentially be previously provided with a protective layer on a first surface of the textile substrate. The first surface of the textile substrate is preferentially the reverse side of the textile. In other embodiments, the first surface of the textile substrate can be the front side of the textile. In this embodiment, the electroluminescent layer arrangement is to be found on the front side of the textile.

Such a protective layer can serve in particular as a protection against undesired impregnation of the fabric with the layer to be applied. Such a protective layer cannot, or can hardly be felt and preserves the textile properties. The thickness of the external protective layer preferentially is in the range from ≥0.5 µm to ≤10 µm, preferentially in the range from ≥1 to ≤5 µm.

It can further be provided that the textile substrate has another protective layer on the second surface of the textile substrate. The second surface of the textile substrate is preferentially the later front side of the textile. Such a coating can provide a protection against external influences, in particular against water and dry atmospheric dirt. The thickness of the external protective layer preferentially is in the range from ≥0.5 µm to ≤10 µm, preferentially in the range from ≥1 to ≤5 µm.

Preferred materials for the protective layer are polymers selected from the group comprising silicones, polyurethanes, polyvinyl chloride, polysulphides and/or acrylates, preferably selected from the group comprising silicones and/or polyurethanes. In especially preferred embodiments, a protective layer on a first surface of the textile substrate, preferentially the later reverse side, comprises a polyurethane. A protective layer on the second surface of the textile substrate, preferentially the later front side, preferably comprises a silicone.

Conductive transparent polymers, preferentially polyethylenedioxithiophene (PEDOT) can preferably be used as a first conductive layer. The conductive layer can also be configured of transparent conductive materials like indium tin oxide. The transparent conductive layer can also be configured of a polyester film which is coated with indium tin oxide (ITO) or another conductive polymer. Indium tin oxide is electrically conductive, as well as transparent, and can advantageously support the high light transmittance of the electroluminescent layer arrangement. A transparent conductive paste comprising synthetic polymer-based polyethylenedioxithiophene (PEDOT) is preferred. In preferred embodiments, the transparent conductive layer has a layer thickness in the range from ≥2 µm to ≤15 µm, preferentially in the range from ≥5 µm to ≤12 µm, preferably in the range of ≥8 µm to ≤10 µm. Furthermore, the transparent conductive layer or front electrode preferentially has a surface coverage in the range from ≥300 $cm^2/g$ to ≤400 $cm^2/g$, preferably of ≥350 $cm^2/g$.

The at least one light emitting layer preferably comprises organic light emitting polymers or inorganic light emitting materials, preferably inorganic light emitting materials. In preferred embodiments, the light emitting layer comprises luminescent pigments which are embedded in an organic or ceramic bonding agent. Inorganic SiC and/or ZnS-based phosphors are preferred luminescent pigments which are doped with metals, preferentially selected from the group comprising Cu, Mn, Ag, Au, Pb, P, As, Sb, Sn, V, Tl, Sc, Cr and/or rare earths. This doping of ZnS or SiC with foreign atoms can result in diverse colors. The color tint and/or the wavelength ranges of the emitted light can be determined in particular by the dopant Zinc sulphide, for example, is preferred as the basis for such a luminescent pigment Zinc sulphide which is doped with metals like copper or manganese is preferred. An especially good light output, in particular planar lighting, can be created if the light emitting layer is applied as thin as possible. In preferred embodiments, the light emitting layer has a layer thickness in the range from ≥2 µm to ≤20 µm, preferentially in the range from ≥5 µm to ≤15 µm, preferably in the range from ≥8 µm to ≤12 µm.

The light emitting layer can be applied over the entire surface or be configured in the form of desired motifs or designs and/or in one or more colors. The light emitting layer can in particular have desired motifs configured in one or more colors. An electroluminescent textile is therefore in particular preferred which has motifs in one or more colors in the light emitting layer. Motifs in the light emitting layer can be produced, for example, by using one or more illuminants containing luminescent pigments of different colors.

The at least one dielectric layer preferentially contains a material with a high dielectric constant, for example barium titanate, which is preferentially distributed in a polymeric bonding agent. The electroluminescent textile preferentially comprises at least two or more dielectric layers. This can result in increased insulating properties, and consequently reduce the risk of a contact between the conductive layers of the layer arrangement. The dielectric layer preferentially covers at least the entire surface of the light emitting layer.

In terms of the present invention, the order of the light emitting layer and the dielectric layer can vary. In one embodiment in which the first surface of the textile substrate configures the reverse side, the light emitting layer under the dielectric layer can be closer to the textile substrate, for example, whereas in another embodiment in which the first surface of the textile substrate configures the front side, the dielectric layer under the light emitting layer can be closer to the textile substrate.

In a preferred embodiment of the electroluminescent textile, in particular produced by means of the method according to the present invention,
- at least one light emitting layer is correspondingly arranged on the transparent conductive layer;
- at least one dielectric layer is correspondingly arranged on the light emitting layer;
- at least a second conductive transparent or non-transparent layer is correspondingly arranged on the dielectric layer.

In another preferred embodiment of the electroluminescent textile, in particular produced with the method according to the present invention,

- at least one dielectric layer is correspondingly arranged on the transparent or non-transparent conductive layer;
- at least one light emitting layer is correspondingly arranged on the dielectric layer;
- at least one conductive transparent layer is correspondingly arranged on the light emitting layer.

In this embodiment, the top layer is preferentially a transparent and/or elastic top layer. This is of advantage because in this embodiment the light path does not only pass through the textile but also through the top layer.

Good insulation associated with good flexibility of the electroluminescent textile could be generated if the at least one dielectric layer(s) has a total layer thickness in the range from ≥10 μm to ≤50 μm. In preferred embodiments, the at least one dielectric layer(s) has a total layer thickness in the range from ≥10 μm to ≤50 μm, preferentially in the range from ≥15 μm to ≤40 μm, preferably in the range from ≥20 μm to ≤30 μm. The dielectric layer preferentially has a layer thickness in the range from ≥5 μm to ≤50 μm, preferentially in the range from ≥8 μm to ≤40 μm, preferably in the range from ≥15 μm to ≤30 μm.

The at least one second conductive layer can be a transparent or non-transparent layer. Conductive polymers, preferentially selected from the group comprising polyaniline, polypyrrole and/or polyethylenedioxithiophene (PEDOT), for example, can be used for the configuration of the conductive layer. Conductive materials, preferably silver- or carbon particles, which are contained in a polymer, can also be used for the configuration of the conductive layer. Silver and polyaniline can preferentially be used. The conductive layer can also be configured of transparent conductive materials like indium tin oxide. Good conductivity associated with good flexibility of the electroluminescent textile can be provided if the at least one second conductive layer(s) has a total layer thickness in the range from ≥10 μm to ≤80 μm. In preferred embodiments, the at least one second dielectric layer(s) has a total layer thickness in the range from ≥10 μm to ≤80 μm, preferentially in the range from ≥15 μm to ≤50 μm, preferably in the range from ≥20 μm to ≤40 μm. A conductive layer preferentially has a layer thickness in the range from ≥5 μm to ≤80 μm, preferentially in the range from ≥15 μm to ≤40 μm, preferably in the range from ≥20 μm to ≤30 μm.

Good electroluminescence and good flexibility of the textile can be provided by coordinating the layer thicknesses. It is especially advantageous that the usual textile hand-feel can be preserved.

In preferred embodiments, the electroluminescent layer arrangement has a conductive bar. The conductive bar is preferably arranged on the first transparent conductive layer.

The electroluminescent layer arrangement preferably has an all round conductive bar, a so-called bus bar. This can advantageously ensure the uniform luminescence of larger surfaces. The conductive bar preferably runs all around the dielectric layer and preferentially rests on the transparent conductive layer. The conductive bar can have the function of an additional peripheral electrode in order to support the transparent first electrode layer for a uniform electric power distribution. The conductive bar is preferably configured of the material of the second conductive layer. The conductive bar, however, preferentially does not contact the second conductive layer as well as the dielectric. This prevents a short-circuit in the electroluminescent layer arrangement. The conductive bar or bus bar preferably has a total layer thickness in the range from ≥10 μm to ≤80 μm, preferably in the range from ≥20 μm to ≤50 μm, preferably in the range from ≥30 μm to ≤40 μm.

It is especially advantageous if the individual layers rest on top of one another as exactly as possible. This allows an interaction of the layers for generating the electroluminescence and to prevent sources of errors. The light emitting layer is preferentially applied centered on the first conductive layer or front electrode. The dielectric layer covers the light emitting layer as completely as possible, preferentially somewhat exceeding the border. The borders of the first conductive layer or front electrode are preferably not covered so that they can be contacted with an electric power supply. The second conductive layer or rear electrode does not touch the first conductive layer or front electrode. Short-circuits can be prevented in this way.

The electroluminescent textile optionally comprises electrical connection elements on the conductive layers. An additional connection element, for example a metal foil, in particular a copper foil, can preferably be attached to the lateral borders of the transparent conductive layer, in particular to the conductive layer and [to] the second conductive layer, the rear electrode. The connection element, for example a copper foil, can advantageously contribute to easier handling and/or to a more uniform electric power distribution.

The electroluminescent textile preferentially comprises a top layer on the electroluminescent layer arrangement, in particular on the second conductive layer. The top layer can provide various advantages, an electrical insulation of the electroluminescent layer arrangement, for example. The risk of a short-circuit due to a contact of the layers on handling the electroluminescent textile can consequently be reduced for example. Furthermore, the risk of an electric shock for a person touching the textile can also be reduced. A top layer can further insulate the coated surfaces of the textile from other coated or non-coated surfaces. The top layer is preferentially a non-transparent and/or elastic top layer. The top layer preferably has electrical insulating properties. Insulating materials selected from the group comprising polyurethanes, acrylates, polyvinyl chloride and/or polytetrafluoroethylene (PTFE) can preferably be used. It is of particular advantage here that such a top layer or protective laminate does not affect the electroluminescent properties of the textile. Furthermore, the textile hand-feel of the textile surface is not affected by a rear top layer or protective laminate.

In other embodiments the top layer can likewise have a motif and/or dye, preferentially if the top layer is the side of the electroluminescent textile facing the observer.

The electroluminescent textile preferentially has an electric power supply, and also advantageously has an inverter, which can be integrated into the textile substrate. This makes it possible, for example, to configure the electroluminescent textile as an article of clothing.

Another subject matter of the invention relates to the use of an electroluminescent textile according to the present invention, in particular an electroluminescent textile produced according to the present invention, as an article of clothing, a safety textile, a household textile or as a luminous textile surface.

The advantageous configuration of the electroluminescent textile, in particular of an electroluminescent textile produced according to the present invention, as a woven or nonwoven fabric, as a wallpaper, carpet, curtain, as drapes, upholstery fabric for covers and/or dressings provides a plurality of applications.

Electroluminescent textiles offer a particularly wide range of applications as household textiles, in particular for lighting or for interior and workspace design, as decorative textiles, as articles of clothing, in particular for safety clothing, or in the automobile industry, as self-luminous headliners in passenger compartments or as a self-luminous lining of a car trunk.

Electroluminescent textiles can also be used for cushions and covers. This feature provides a plurality of applications in the furniture industry. Special effects are obtained, for example, by the configuration as household textiles like wallpapers and similar decorative surfaces, carpets or drapes like curtains. The use of such electroluminescent textiles especially allows for a large area distribution of the luminescence in the room arranged herewith. Mainly the changing effects resulting from especially selecting motifs for daylight and for darkness are of great relevance to the design possibilities.

Passenger compartments in means of transport, car seats or loading areas in motor vehicles can also be made accessible for lighting by using electroluminescent textiles.

Textiles with electroluminescent properties can also be used in the field of safety clothing and technical applications. Electroluminescent textiles can for example be advantageously used for warning safety clothing or high-visibility clothing. Electroluminescent textiles offer a wide range of possibilities for the production of luminous effects on warning and safety clothing. The applications range from warning clothing for street workers, medical and safety services and police to protective suits for firemen and accessories like belts for cyclists and joggers, or school and kindergarten bags for children and students. The special property of the electroluminescent textiles, in particular the possibility of a light connection as a warning, for example, additionally makes it possible to produce inconspicuous clothing for security staff working in personal protection who can identify themselves by means of their clothing if required.

BRIEF DESCRIPTION

Examples and figures for the exemplification of the present invention are shown below.

Figure 2:
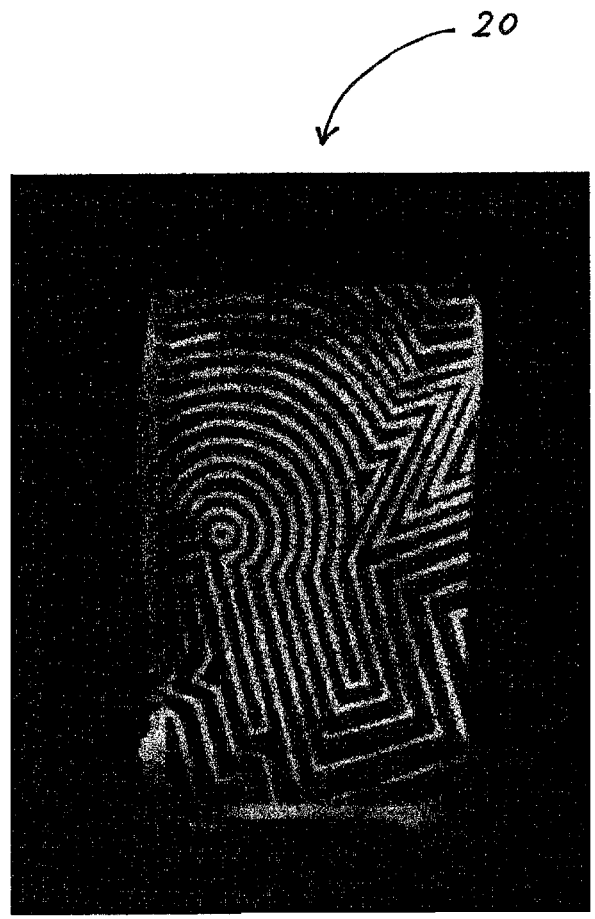

The figures show:

FIG. 1 a schematic representation of the layer arrangement of an electroluminescent textile;

FIG. 2 an image of the electroluminescent textile with connected power supply.

DETAILED DESCRIPTION OF THE DRAWINGS

According to the exemplary schematic representation of the layer arrangement of an electroluminescent textile shown in FIG. 1, the layer arrangement 10 of an electroluminescent textile has an electroluminescent textile substrate 1, a protective layer 2, a first transparent conductive layer or front electrode 3, a light emitting layer 4, a dielectric layer 5, a second conductive layer or rear electrode 6, a conductive bar 7 and a top layer 8.

EXAMPLE 1

A very dense scotched canvas from BW Industrial made of 100% polyester with a weight per unit area of 176 g/m$^2$ and 45 threads/cm in warp and weft direction was used as a base material. The material was previously desized with 1 g/l of non-ionic laundry detergent (Felosan Rg-N from CHT) at 95° C. for 20 minutes on a jigger (E. Benz). Approximately 5% of desizing coating was removed for further processing. Subsequently, the material was thermofixated in a laboratory continuous hot air dryer (type KTF/m 350, Mathis AG) at 190° C. for one minute.

For patterning purposes, the top side of the fabric was screen printed with a geometrical pattern with pigment printing paste (Helizarin blue, from BASF) on a semi-automatic magnet knife-over-roll table (MDFR 242, from J. Zimmer) and again dried in the dryer (Mathis, type DHe) at 130° C. for one minute.

Various layers of the electroluminescent layer arrangement were successively applied on the reverse side of this pretreated fabric on a laboratory manual spreader (type GST 500, from E. Benz). The first transparent conductive layer, or front electrode, was applied in the form of a transparent conductive paste made of a synthetic polymer-based 3,4-polyethylene-dioxithiophene (PEDOT) dispersion (Ormecon® EL 5602, from Ormecon) over an area of 25 cm×30 cm with a layer thickness of 8 µm, and subsequently dried at 130° C. for 5 minutes in the laboratory continuous dryer (type TKF 15 M 500, from E. Benz). The light emitting layer or phosphor layer was then applied in the form of a paste (Ormecon® EL 5400, from Ormecon) over an area of 12 cm×20 cm with a layer thickness of 8 µm, and dried at 90° C. for 5 minutes. This layer was subsequently completely covered with two layers of a dielectric layer. The dielectric was applied as a paste (Ormecon® EL 5500, from Ormecon) over an area of 14 cm×22 cm with a thickness of 15 µm each, intermediately drying the individual layers at 90° C. for 5 minutes.

Two layers of a second conductive layer were finally applied. The rear electrode was applied as a paste (Ormecon® EL 5800, from Ormecon) over an area of 12 cm×20 cm with a layer thickness of 20 µm, and dried at 90° C. for 5 minutes each. Finally, a so-called bus bar, a conductive bar, was brushed on the outer border of the transparent conductive layer or front electrode similarly to a picture frame with the paste of the rear electrode across a width of 1 cm and a layer thickness of 20 µm. The bus bar only touched the front electrode in order to prevent short-circuits. Said bus bar was also dried at 90° C. for 5 minutes.

Subsequently, a copper strip measuring 5×0.5 cm in length was respectively affixed on the bus bar and on the rear electrode. This copper strip served for a more uniform distribution of the electric power supply. One phase of the electric cable was attached to one copper strip and the other phase to the other strip. Prior to the connection to the inverter (Zigan, type EL sheet inverter, Model LF 3312) and to the power line, the entire pattern was cold-laminated at the back on the rear electrode with a self-adhesive protective film.

As shown in FIG. 2, it was found that the applied geometrical pattern of the electroluminescent textile 20 was visible over the entire surface and shining brightly in light turquoise. The electroluminescent canvas fabric further had a flexibility that was almost identical to that of the coated and uncoated surfaces.

EXAMPLE 2

A very open colored leno fabric produced on an Easy-Leno loom at the Niederrhein University of Applied Sciences consisting of 30% polyester/70% cotton and a weight per unit area of 130/m$^2$ and 40 threads/cm in weft direction was used as base material. The material was previously desized with 1 g/l of non-ionic laundry detergent (Felosan Rg-N, from CHT) at 95° C. for 20 minutes on a jigger (E. Benz). Approximately 5% of desizing coating was removed for further processing. Subsequently, the material was thermofixated in a laboratory continuous hot air dryer (type KTF/m 350, Mathis AG) at 190° C. for one minute. Patterning was provided in the weft due to the weave construction and the selection of colored cotton yarns.

The layers of the electroluminescent layer arrangement were successively coated on a laboratory manual spreader (type GST 500, from E. Benz). The coated fabric was dried in a laboratory continuous hot air dryer (E. Benz, type KTF 15 M 500).

As a protection against soiling during use, this material was first coated with a non-conductive silicone (Elastolsil LR 3003/30 A/B, from Wacker) with a layer thickness of 10 μm and at 165° C. for 5 minutes.

In order to compensate a relatively strong 3D structure of the fabric and to prevent the layers from being interpenetrated, a "protective" layer consisting of a clear polyurethane polymer (CHT Tubicoat PUS+Lutexal HIT thickener) was applied to the reverse side of the material. The polyurethane polymer was applied with a layer thickness of 15 μm and condensed at 140° C. for 1 minute.

The first transparent conductive layer, or front electrode, was applied in the form of a transparent conductive paste (Ormecon® EL 5602, from Ormecon) over an area of 25 cm×30 cm with a layer thickness of 8 μm and dried at 130° C. for 5 minutes. The phosphor layer was then applied in the form of a paste (Ormecon® EL 5400, from Ormecon) over an area of 12 cm×20 cm with a layer thickness of 8 μm and dried at 90° C. for 5 minutes. This layer was subsequently completely covered with two layers of dielectric (Ormecon® EL 5500, Ormecon) over an area of 14 cm×22 cm with a thickness of 15 μm each. The layers were each intermediately dried at 90° C. for 5 minutes. Finally, two layers of the rear electrode were applied as a paste (Ormecon® EL 5800, from Ormecon) over an area of 12 cm×20 cm with a layer thickness of 20 μm each, and respectively dried at 90° C. for 5 minutes. Finally a so-called bus bar was brushed on the outer border of the front electrode similarly to a picture frame with the paste of the rear electrode across a width of 1 cm and a layer thickness of 20 μm. The bus bar only touched the front electrode in order to prevent short-circuits. Said bus bar was also dried at 90° C. for 5 minutes.

Subsequently, a copper strip measuring 5×0.5 cm in length was respectively affixed on the bus bar and on the rear electrode. This copper strip served for a more uniform distribution of the electrical power supply. One phase of the electric cable was attached to one copper strip and the other phase to the other strip. Prior to the connection to the inverter (Zigan) and to the power line, the entire pattern was cold-laminated at the back on the rear electrode with a self-adhesive protective film.

After the connection to the power line, it was found that the produced pattern exhibited a uniform, bright, blue-white luminescence. The textile look of the fabric was also integrated in the luminous pattern. It was found in particular that the produced electroluminescent textile preserved its textile hand-feel and flexibility.

The invention claimed is:

1. A method for the production of an electroluminescent textile comprising the following steps:
   providing a textile substrate having a front side and a reverse side;
   optionally applying a protective layer on the reverse side of the textile substrate;
   applying a first transparent conductive layer on at least one of the reverse side of the textile substrate and the protective layer;
   applying at least one light emitting layer on the first transparent conductive layer;
   applying at least one dielectric layer on the at least one light emitting layer;
   applying at least a second conductive layer on the at least one dielectric layer;
   optionally attaching a plurality of connection elements to the first transparent conductive layer and the second conductive layer;
   applying a top layer on the electroluminescent textile;
   electrically connecting the first transparent conductive layer and the second conductive layer to an electric power supply; and
   resting a single conductive bar on the first transparent conductive layer, the single conductive bar extending around one or more sides of the at least one dielectric layer;
   wherein a luminous path passes through the textile substrate from the reverse side to the front side.

2. The method according to claim 1, wherein the protective layer, the first transparent conductive layer, the at least one light emitting layer, the at least one dielectric layer, the at least one second conductive layer, and the top layer are applied by continuous or discontinuous coating.

3. The method according to claim 2, wherein the continuous or discontinuous coating is accomplished by spreading, blade coating, web feeding, roller coating, spraying or dipping, continuous or discontinuous printing by means of a direct printing method selected from the group consisting of: screen printing, roller printing, digital printing and/or transfer printing.

4. The method according to claim 1, wherein the method comprises the step of applying a motif to the front side of the textile substrate.

5. The method according to claim 4, wherein the motif is applied by a means of at least one of printing and dyeing on a second surface of the textile substrate.

6. The method according to claim 1, further comprising:
   a first transparent conductive layer having a layer thickness in a range from ≥2 μm to ≤15 μm;
   at least one light emitting layer having a total layer thickness in a range from ≥2 μm to ≤20 μm;
   at least one dielectric layer having a total layer thickness in a range from ≥10 μm to ≤50 μm; and
   at least a second conductive layer having a total layer thickness in a range from ≥10 μm to ≤80 μm.

7. The method according to claim 6, further comprising:
   the first transparent conductive layer having a layer thickness in a range from ≥8 μm to ≤10 μm;
   the at least one light emitting layer having a total layer thickness in a range from ≥8 μm to ≤12 μm;
   the at least one dielectric layer having a total layer thickness in a range from ≥20 μm to ≤30 μm; and
   the at least a second conductive layer having a total layer thickness in a range from ≥20 μm to ≤40 μm.

8. The electroluminescent textile produced with a method according to claim 1.

9. The method according to claim 1, wherein the electroluminescent textile is produced as at least one of an article of clothing, a safety textile, a household textile, and a luminous textile surface.

10. The method for the production of an electroluminescent textile according to claim 1, wherein a transparent conductive paste based on a polyethylenedioxithiophene (PEDOT) dispersion is applied for forming the first transparent conductive layer.

11. An electroluminescent textile comprising:
   a textile substrate, the textile substrate including a front side and a reverse side;
   a protective layer on the reverse side of the textile substrate;
   a first transparent conductive layer on at least one of the reverse side of the textile substrate and on the protective layer;

at least one light emitting layer;

at least one dielectric layer;

at least one second conductive transparent or non-transparent layer;

a top layer; and a single conductive bar resting on the first transparent conductive layer, the single conductive bar extending around one or more sides of the at least one dielectric layer;

wherein a luminous path passes through the textile substrate from the reverse side to the front side.

12. The electroluminescent textile of claim 11, further comprising a plurality of electrical connection elements attached to the conductive layers.

13. The electroluminescent textile according to claim 11, wherein the front side of the textile substrate comprises a motif print.

14. The electroluminescent textile according to claim 11, wherein the at least one light emitting layer has a plurality of motifs configured in one or more colors.

15. The electroluminescent textile according to claim 11, further wherein the first transparent conductive layer has a layer thickness in a range from $\geq 2$ µm to $\leq 15$ µm;

the at least one light emitting layer has a total layer thickness in a range from $\geq 2$ µm to $\leq 20$ µm;

the at least one dielectric layer has a total layer thickness in a range from $\geq 10$ µm to $\leq 50$ µm; and the at least second conductive layer has a total layer thickness in a range from $\geq 10$ µm to $\leq 80$ µm.

16. The electroluminescent textile according claim 15, further wherein the first transparent conductive layer has a layer thickness in a range from $\geq 8$ µm to $\leq 10$ µm;

the at least one light emitting layer has a total layer thickness in a range from $\geq 8$ µm to $\leq 12$ µm;

the at least one dielectric layer has a total layer thickness in a range from $\geq 20$ µm to $\leq 30$ µm; and the at least second conductive layer has a total layer thickness in a range from $\geq 20$ µm to $\leq 40$ µm.

17. The electroluminescent textile according to claim 11, wherein the first transparent conductive layer comprises polyethylenedioxithiophene (PEDOT).

18. The electroluminescent device of claim 12, wherein as material of the textile substrate is selected from the group consisting of: cotton, silk, linen and synthetic fibers selected from the group comprising polyamide, polyacryl, elastane, polyester, and polyethylene.

* * * * *

UNITED STATES PATENT AND TRADEMARK OFFICE
CERTIFICATE OF CORRECTION

PATENT NO. : 8,952,610 B2
APPLICATION NO. : 13/320555
DATED : February 10, 2015
INVENTOR(S) : Maike Rabe, Evelyn Lempa and Christine Maria Steinem It is certified that error appears in the above-identified patent and that said Letters Patent is hereby corrected as shown below:

In the Claims

In Claim 18, Column 24 Line 20, replace the number "12" with number "11."

Signed and Sealed this
Seventh Day of July, 2015

Michelle K. Lee
*Director of the United States Patent and Trademark Office*

UNITED STATES PATENT AND TRADEMARK OFFICE
CERTIFICATE OF CORRECTION

PATENT NO. : 8,952,610 B2  
APPLICATION NO. : 13/320555  
DATED : February 10, 2015  
INVENTOR(S) : Maike Rabe, Evelyn Lempa and Christine Maria Steinem Page 1 of 1

It is certified that error appears in the above-identified patent and that said Letters Patent is hereby corrected as shown below:

In the Claims

In Claim 18, Column 24, Line 20, replace "The electroluminescent device of claim 11," with "The electroluminescent textile according to claim 11,".

Signed and Sealed this  
Twenty-ninth Day of December, 2015

Michelle K. Lee  
*Director of the United States Patent and Trademark Office*